(12) United States Patent
Uzoh et al.

(10) Patent No.: US 7,416,975 B2
(45) Date of Patent: Aug. 26, 2008

(54) METHOD OF FORMING CONTACT LAYERS ON SUBSTRATES

(75) Inventors: Cyprian E. Uzoh, San Jose, CA (US); Bulent M. Basol, Manhattan Beach, CA (US); Hung-Ming Wang, San Jose, CA (US); Homayoun Talieh, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 346 days.

(21) Appl. No.: 11/232,718

(22) Filed: Sep. 21, 2005

(65) Prior Publication Data

US 2007/0066054 A1  Mar. 22, 2007

(51) Int. Cl.
*H01L 21/44* (2006.01)
(52) U.S. Cl. .............. 438/652; 438/677; 257/E21.586; 257/E21.479
(58) Field of Classification Search ........ 438/652, 438/676; 439/677; 483/652; 257/753, E21.586, 257/E21.479; 427/458
See application file for complete search history.

(56) References Cited

U.S. PATENT DOCUMENTS

| | | | | |
|---|---|---|---|---|
| 6,117,299 | A * | 9/2000 | Rinne et al. ............. | 205/125 |
| 6,630,387 | B2 * | 10/2003 | Horii .................... | 438/396 |
| 6,977,223 | B2 * | 12/2005 | George et al. .......... | 438/676 |
| 7,078,308 | B2 * | 7/2006 | Lee et al. .............. | 438/387 |
| 7,179,361 | B2 * | 2/2007 | Collins et al. ........... | 205/136 |

FOREIGN PATENT DOCUMENTS

| | | |
|---|---|---|
| DE | 2008 664 | 9/1970 |
| DE | 43 24 330 A1 | 2/1994 |
| EP | 1 037 263 B1 | 2/2000 |
| JP | 2000-208443 | 7/2000 |
| WO | WO 98/27585 | 6/1998 |
| WO | PCT/US01/05552 | 3/2000 |
| WO | WO 00/26443 | 5/2000 |
| WO | WO 01/32362 A1 | 5/2001 |

OTHER PUBLICATIONS

Cantolini et al., "Electrochemical Planarization for Multilevel Metallization," *Electrochem. Soc.*, vol. 141, No. 9 (Sep. 1994).
Kelly et al., "Leveling and Microstructural Effects of Additives for Copper Electrodeposition," *Journal of the Electrochemical Society*, 146 (7) 2540-2545 (1999).
Madore et al. "Blocking Inhibitors in Cathodic Leveling," *J. Electrochem. Soc.*, vol. 143, No. 12 (Dec. 1996).

(Continued)

*Primary Examiner*—Caridad M Everhart
(74) *Attorney, Agent, or Firm*—Knobbe, Martens, Olson & Bear, LLP

(57) ABSTRACT

A method is provided for manufacturing removable contact structures on the surface of a substrate to conduct electricity from a contact member to the surface during electroprocessing. The method comprises forming a conductive layer on the surface. A predetermined region of the conductive layer is selectively coated by a contact layer so that the contact member touches the contact layer as the electroprocessing is performed on the conductive layer.

37 Claims, 4 Drawing Sheets

OTHER PUBLICATIONS

Mikkola et al., "Investigation of the Roles of the Additive Components for Second Generation Copper Electroplating Chemistries Used for Advanced Interconnect Metalization," Proceedings of the IEEE 2000 International Interconnect Technology Conference, Burlingame, California (Jun. 5-7, 2000).

Reid et al., "Factors Influencing Damascene Feature Fill Using Copper PVD and Electroplating," *Solid State Technology*, 86-103 (Jul. 2000).

Rubinstein, Dr. Mary, "Tampongalvanisieren in der Praxis Teil 1," *Galvanotechnik*, P-7089 Saulgau 78 Nr. 10 (1987).

Steigerwald et al., "Pattern Geometry Effects in the Chemical-Mechanical Polishing of Inlaid Copper Structures," *J. Electrochem. Soc.*, vol. 141, No. 10 (Oct. 1994).

Steigerwald et al., "Chemical Mechanical Planarization of Microelectronic Materials," A Wiley Interscience Publication, John Wiley & Sons, Inc., New York, 212-223.

West et al., "Pulse Reverse Copper electrodeposition in High Aspect Ratio Trenches and Vias," *J. Electrochem. Soc.*, vol. 145, No. 9 (Sep. 1998).

\* cited by examiner

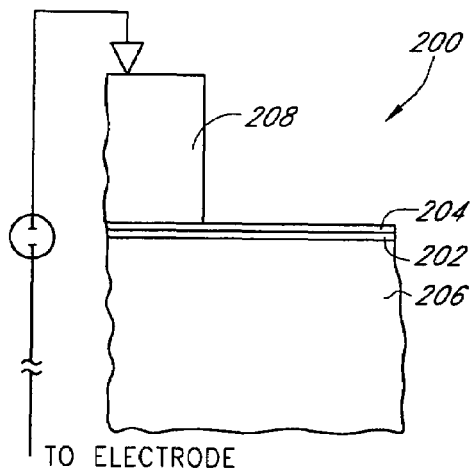
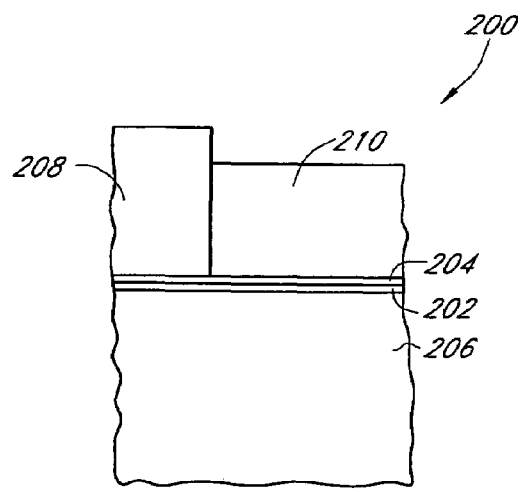
FIG. 6A    FIG. 6B
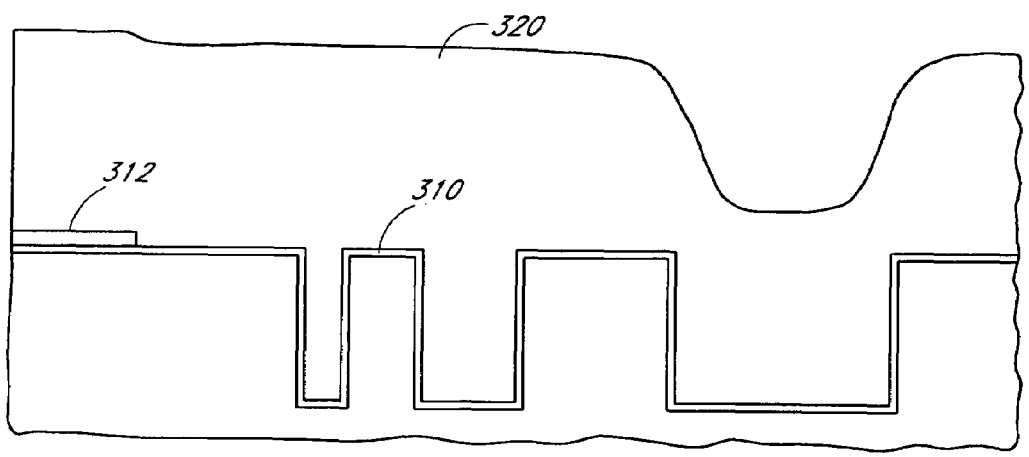
FIG. 9

METHOD OF FORMING CONTACT LAYERS ON SUBSTRATES

FIELD

The present invention generally relates to semiconductor processing technologies and, more particularly, to an electrodeposition process employing selective formation of contact layers on substrates.

BACKGROUND

Conventional semiconductor devices generally include a semiconductor substrate, usually a silicon substrate, and a plurality of sequentially formed dielectric interlayers such as silicon dioxide and conductive paths or interconnects made of conductive materials. The interconnects are usually formed by filling a conductive material in trenches etched into the dielectric interlayers. In an integrated circuit, multiple levels of interconnect networks laterally extend with respect to the substrate surface. The interconnects formed in different layers can be electrically connected using vias or contacts. A metallization process can be used to fill such features, i.e., via openings, trenches, pads or contacts by a conductive material.

Copper (Cu) and copper alloys have recently received considerable attention as interconnect materials because of their superior electromigration and low resistivity characteristics. The preferred method of copper metallization is electroplating. FIG. 1 shows a substrate 10 prepared for an electroplating process. The substrate 10 is an exemplary surface portion on a front surface of the wafer W shown in FIG. 2, which includes a border region between the edge of the surface and the rest of the surface or the central surface region of the wafer W. Referring back to FIG. 1, for interconnect fabrication, the substrate 10 includes a dielectric layer 12 having features 14, such as vias and trenches, formed in it. The substrate 10 is typically coated with a barrier layer 16 and a seed layer 18. Typical barrier layer materials include tungsten, tantalum, titanium, their alloys, and their nitrides. The barrier layer 16 coats the substrate to ensure good adhesion and acts as a barrier to prevent diffusion of the copper into the dielectric layers and into the semiconductor devices. The seed layer 18, which is often a copper layer, is deposited on the barrier layer 16. The seed layer 18 forms a conductive material base for the copper film growth during the subsequent copper deposition. As shown at the left side of FIG. 1, to enable copper deposition from a copper containing electrolyte, an electrical contact is connected to the seed layer 18 and a potential difference is established between an electrode and the seed layer 18.

The copper seed layers for copper interconnects are typically deposited by physical vapor deposition (PVD) techniques. As the feature size goes to 32 nanometers (nm) and below, seed layers in the thickness range of 5-20 nm will be desirable to coat such tiny features. The most common problem associated with such thin seed layer deposition is poor step coverage, which may give rise to discontinuities in the seed layer and related defects especially within the smallest features having the highest aspect ratios. Due to imperfect conformality, the seed layer thickness at the lower, portions or on the side-walls of the vias and trenches may be very low, such as less than 3 nm, or the seed layer at such locations may be discontinuous. Thin portions of the seed layer may contain large amounts of oxide phases that are not stable in plating solutions. During the subsequent copper deposition process, such defective areas cause unwanted voids in the copper filling, leading to inadequately filled vias and trenches, high resistance and short lifetime for the interconnect structure. Oxidation problems are further exacerbated by exposure of seed layers to outside conditions as the wafers coated with seed layers are transported from the seed deposition unit to an electrochemical deposition unit for copper fill.

Establishing an electrical connection to such thin seed layers presents another difficulty. When such delicate layers are physically touched by electrical contacts they may get smeared, scratched, lifted up or otherwise damaged. Damaged areas of seed layers do not conduct electricity adequately. Therefore, any discontinuity or damaged area in the seed layer around the perimeter of the workpiece or wafer causes variations in the density of the delivered current, which in turn negatively impacts the plating uniformity.

As technology nodes are reduced to 32 nm and below, one option is to eliminate the use of the copper seed layer and deposit copper directly on the barrier layer or on a nucleation layer, such as a ruthenium (Ru) layer. In this case, the resistivity of the barrier layer or the nucleation layer is much larger (by at least a factor of 5) than the resistivity of the copper layer. Consequently, when an electrical contact is made to this high resistivity layer for the purpose of electrodepositing a copper layer, the contact resistance is expected to be larger than the contact resistance with a copper seed layer. When the density of current passed through contacts made to high resistivity thin layers is large, heating occurs at points where the electrical contacts physically touch the thin layers. Excessive voltage drop at these locations, in addition to sparking and heating, causes damage to the thin barrier layer and/or the nucleation layer, thus exacerbating the problem even further and causing additional non-uniformities in the deposited copper layers.

To this end, there is a need for alternative methods to enable deposition of conductors, such as copper, on workpieces or wafers comprising very thin seed layers or barrier/nucleation layers without causing damage to such thin layers and without causing non-uniformities in the deposited conductor thickness.

SUMMARY

According to one aspect of the invention, a method is provided for manufacturing contact structures on a surface of a substrate to conduct electricity from a contact member to the surface when the surface is electroprocessed. The method comprises forming a conductive layer on the surface. A predetermined region of the conductive layer is selectively coated by a contact layer so that the contact member touches the contact layer as electroprocessing is performed on the conductive layer.

According to another aspect of the invention, a method is provided for applying an electrochemical process to a surface of a wafer. The method comprises forming a conductive layer on the surface of the wafer. A portion of the conductive layer is selectively coated by a contact layer. The contact layer is touched with a contact member in order to connect the contact layer to a power supply. An electrical potential is applied to the contact member.

According to yet another aspect of the invention, a structure for electroprocessing a substrate is provided. The structure comprises a conductive layer formed on a surface of the substrate. A removable contact layer is formed on the conductive surface along an edge region of the substrate. A contact member touches the removable contact layer and connects the removable contact layer to a power supply during electroprocessing of the substrate.

BRIEF DESCRIPTION OF THE DRAWINGS

FIGS. 6A-6B are schematic cross sections of the contact layer, in accordance with a preferred embodiment of the invention;

FIG. 9 is a schematic cross section of the conductive surface of FIG. 7, wherein plating has continued and the conductive layer is left non-planar, in accordance with a preferred embodiment of the invention.

DETAILED DESCRIPTION

The present invention provides methods of forming an electrical contact layer or a contact layer on wafers to conduct electricity to a conductive surface of a wafer to enable electrochemical processing of the wafer. Electrochemical processing includes, but is not limited to, processes such as electrochemical deposition (ECD), electrochemical mechanical deposition (ECMD), electropolishing and electrochemical mechanical polishing (ECMP). Preferably, the electrical contact layer is a temporary layer partially covering the conductive wafer surface.

The conductive surface of the wafer may comprise any conductive material, for example a seed layer or a barrier layer material, or any other conductive material, such as a nucleation layer that enhances the nucleation capability of metal to be processed, such as copper.

Ruthenium (Ru) is known to be such a nucleation layer. In the illustrated embodiments, the contact layer will be utilized for copper electrodeposition and will be formed on a copper seed layer and on a barrier layer which is often tantalum (Ta), tantalum nitride (TaN), or both. The contact layer may extend along the circumference of the wafer in a continuous or discontinuous manner. An electrical contact member connects the contact layer to a power supply. The electrical contact member may be engaged with the contact layer in a dynamic or static manner. In dynamic manner, relative motion is established between the contact layer and the contact member as the electricity is conducted to the contact layer. In static manner, the contact member is placed on the contact member and is stationary on the contact layer.

Figure 1:
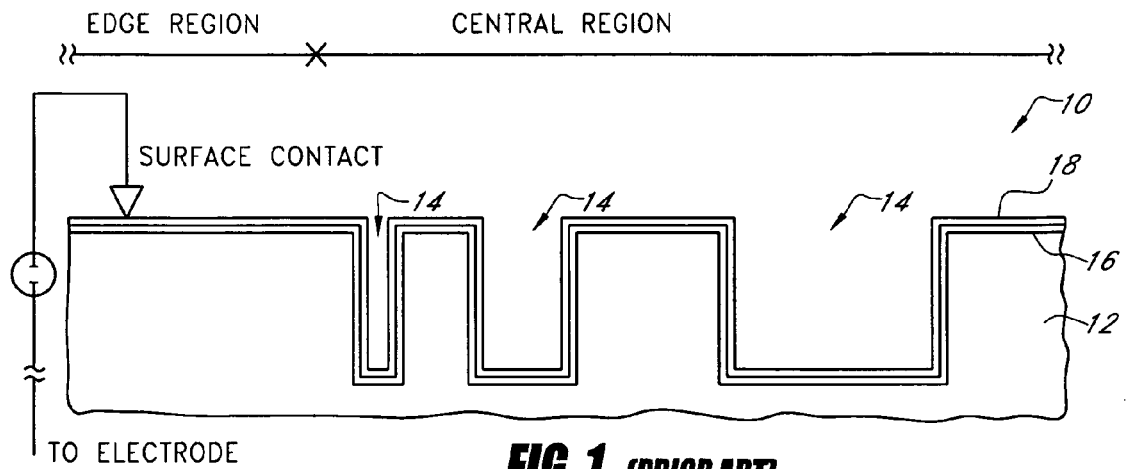
FIG. 1 is a schematic cross section of a conductive region of a wafer surface configured to conduct current to an edge region of the wafer surface, in accordance with a prior art method.
Figure 2:
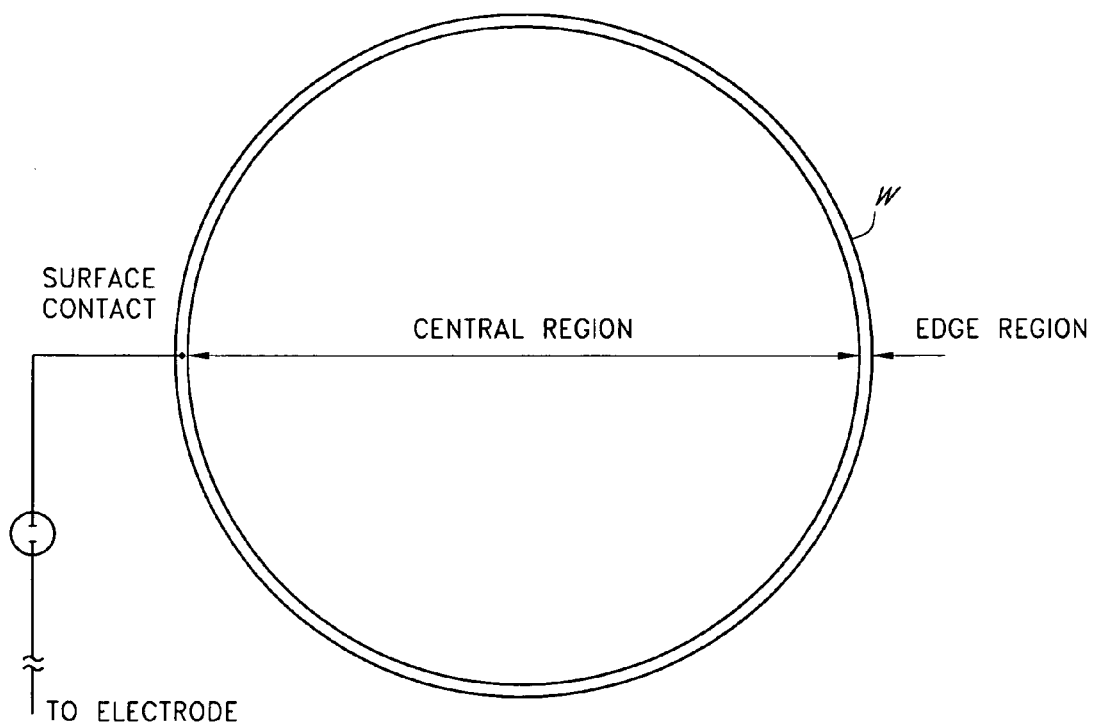
FIG. 2 is a schematic plan view of the conductive surface of the wafer in FIG. 1, showing the edge region where electrical contacts are placed.
Figure 3:
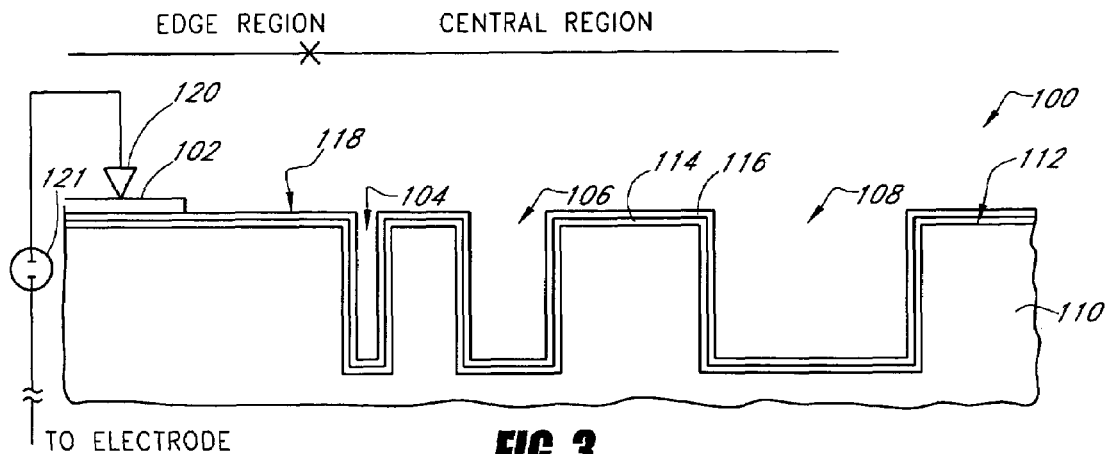
FIG. 3 is a schematic cross section of the edge region of a conductive surface of a wafer comprising a contact layer through which current is conducted, in accordance a with preferred embodiment of the invention.

FIG. 3 shows an exemplary substrate 100 on which a contact layer 102 or a disposable layer of the present invention is formed. For purposes of clarity, the substrate 100 exemplifies an edge portion of a wafer (not to scale), which may be identical to the wafer W shown in FIG. 2. In this example, the contact layer 102 is preferably utilized for the electrodeposition of conductors such as copper and other metals. The substrate 100 comprises a plurality of features, such as a via 104, a mid-sized trench 106 and a large trench 108, all formed in a dielectric layer 110 using conventional techniques. In this embodiment, surface 112 of the dielectric layer 108 and the features 104, 106, 108 are lined with a barrier layer 114. A copper seed layer 116 comprising a surface 118 is formed on the barrier layer 114. The barrier layer 114 and the seed layer 116 cover the surface of the wafer in its entirety, including the edge or the circumference region of the front surface. The barrier layer 114 and the seed layer 116 may also wrap around the side bevel of the wafer. For purposes of clarity only, the edge region of the front surface in the figures is shown without features 104, 106 and 108, though in practice the features 104, 106 and 108 may extend into the edge region.

The contact layer 102 may fully or partially cover the edge region on the surface 116 along the perimeter of the wafer W. Further, it is possible to build the contact layer 102 along the bevel of the wafer W or along the edge of the back surface of the wafer W as long as the contact layer 102 is in contact with the seed layer 116. It would be appreciated that the term "edge region" in the preferred embodiments defines an area from the back edge through the bevel and front edge of the wafer W.

The contact layer 102 may be selectively formed on any or all of these locations in a continuous or a discontinuous manner. The contact layer 102 may have a width in the range of 0.5-5 mm and a thickness in the range of 0.1-100 micrometers ($\mu$m). The contact layer 102 can be formed using a variety of processes. In some preferred embodiments, the contact layer 102, which is preferably a conductive tape or, more preferably, a thin copper tape, is disposed along the edge region using a conductive adhesive or attaching mechanically around the edge of the wafer by clamping. In an alternative embodiment, a thin conductive paste comprising conductors such as, e.g., Cu, Ni, Ag, or Au, may be applied to the edge region to form the contact layer 102. In yet another embodiment, the contact layer 102 may be formed by any of electrodeposition, chemical vapor deposition (CVD), or PVD, in addition to appropriate masking techniques to protect the central region of the wafer W from such deposition.

Figure 4:
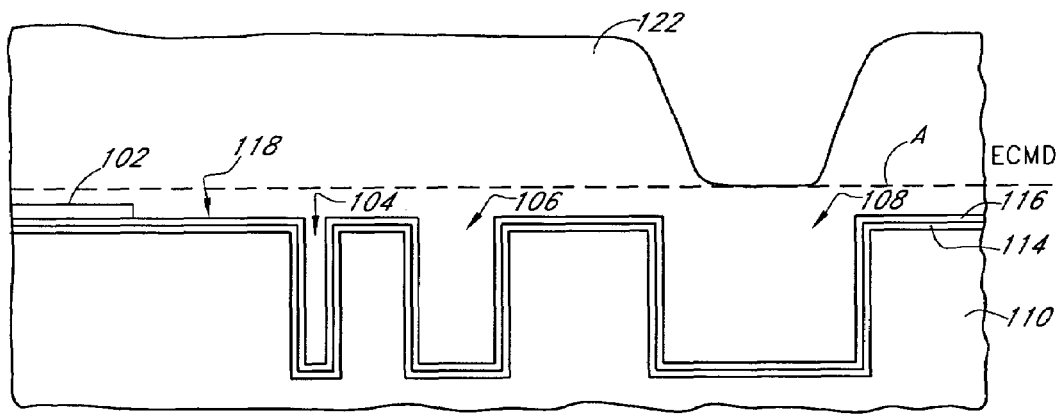
FIG. 4 is a schematic cross section of the conductive surface shown in FIG. 3, wherein a conductor layer has been formed on the conductive surface, in accordance with a preferred embodiment of the invention.

With reference to FIGS. 3 and 4, after forming the contact layer 102 on the surface 118 of the seed layer 116, a conductive layer 122 is electrodeposited on the seed layer 116 by applying an electrical potential difference between a contact member 120 and an electrode (not shown) while wetting the seed layer 116 and the electrode by a process solution (e.g., electrolyte). In the preferred embodiments, the conductive layer 122 is preferably made of metal or, more preferably, Cu. The contact member 120 and the electrode are connected to the terminals of a power supply 121. The wafer W can be supported by a wafer carrier (not shown) and may be rotated during electrodeposition. The contact member 120 may be dynamically engaged with the contact layer 102, and a relative motion may be established between the contact member 120 and the contact layer 102 (hence the substrate).

With reference to FIG. 4, with such a dynamic configuration, the conductive layer 122 may grow on the edge region and on the contact layer 102. In some embodiments, the contact layer 102 is used with stationary contacts or other edge-excluding contacts. Such stationary contacts prevent material from depositing onto the contact layer 102 at the point(s) (not shown in FIG. 4) where the contact member 120 is in physical contact with the contact layer 102. Electrodeposition on the contact layer 102 may be avoided by shielding the contact layer 102 or portions thereof from the electrolyte using seals or clamps with seals. The conductive layer 122 may be deposited using electrochemical deposition (ECD) or a planar electrodeposition method, such as electrochemical mechanical deposition (ECMD). For the sake of example only, an ECMD-deposited planar conductive layer is marked by dotted line A. ECMD refers to a process in which the wafer surface is swept by a pad intermittently during plating, resulting in faster growth inside vias and trenches (or spaces), and leaving a planar conductive layer depicted by the line A.

Figure 5:
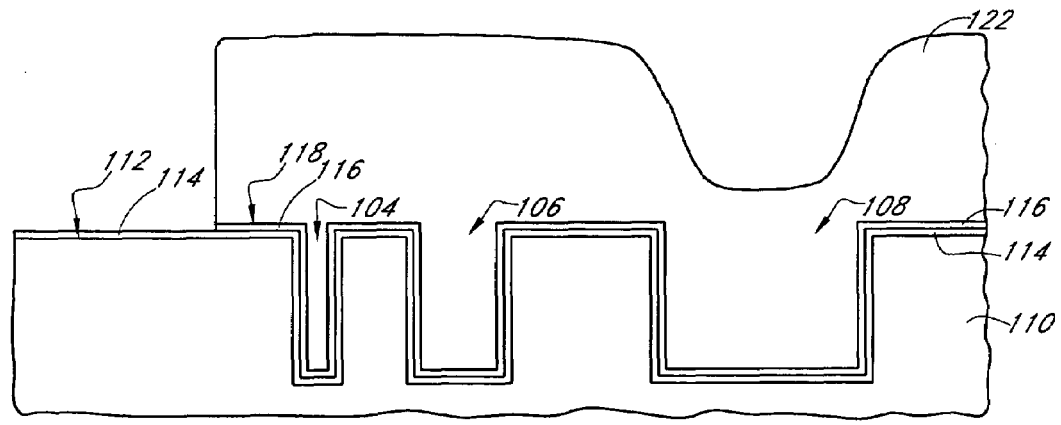
FIG. 5 is a schematic cross section of the conductive surface shown in FIG. 4, wherein the contact layer has been removed from the edge region, in accordance with a preferred embodiment of the invention.

With reference to FIG. 5, after electrodepositing the conductive layer 122, the edge portion of the conductive layer 122 and the contact layer 102 are removed using an edge bevel removal (EBR) process. The EBR process exposes the barrier layer 114 at the edge region. During an EBR process, an etching solution is applied to the edge region of an electrodeposited layer of a wafer. The conductor, which is often thick and comprises defects at the wafer edges, is removed from the outer edge of the wafer.

Preferably, during the EBR step, the contact layer 102 is advantageously removed by the application of etching solution to the edge region without needing an extra removal step for the contact layer. It should be noted that removal of material from the edge region of the wafer W may be achieved by physically removing (e.g., peeling) the contact layer 102 after the electrodeposition step. In this case, as the contact layer is peeled off the wafer surface, the deposited material over it is also peeled off and removed. Upon physically removing the contact layer by, e.g., peeling, any material overlying the contact layer 102 is concurrently removed.

After the EBR process, the substrate 100 may be annealed and the conductive layer 122 subsequently planarized by chemical mechanical polishing (CMP). During consecutive CMP processing steps, the conductive layer 122 (copper) and barrier layer 114 on the upper surface 112 of the dielectric layer 110 are planarized, leaving conductive material isolated within the features 104, 106 and 108.

With reference to FIGS. 6A and 6B, in other preferred embodiments of the invention, an alternative contact layer structure is formed on an edge region 200 of the wafer W. The surface of the wafer W comprises a barrier layer 202 and a seed layer 204 deposited on a dielectric layer 206. The contact layer 208 in this embodiment is relatively thick so that when the electrodeposition is performed copper layer 210 grows next to the contact layer. After the electrodeposition, the contact layer 208 is removed using, e.g., the EBR process described above. In the above embodiments, alternatively, the contact layer 208 is initially formed on the barrier layer 202 and the seed layer 204 is subsequently deposited on the barrier layer 202 and the contact layer 208.

The contact layer examples described in the above embodiments can also be used for electropolishing or electrochemical mechanical polishing conductive surfaces of wafers. For example, in electropolishing (or electroplanarization), electrical contacts are placed on edge regions of the surface and a positive potential is applied through an electrode. Material removal occurs electrochemically and, if applicable, mechanically by applying a polishing pad to the surface. Because the contact members are placed on the edge of the wafer, during material removal the edge region may be thinned at a rate that is sufficiently greater than the rate at which the rest of the conductive surface is thinned, which may result in non-uniform removal or planarization of the surface. This over-thinning of the edge can be alleviated by adding contact layers to the conductive surface along the edge region of the wafer and making electrical contact to the contact layers by contact elements. This way, during the material removal, contact members physically contact the contact layers, thus protecting the conductive surface under the contact layer from premature removal.

Figure 7:
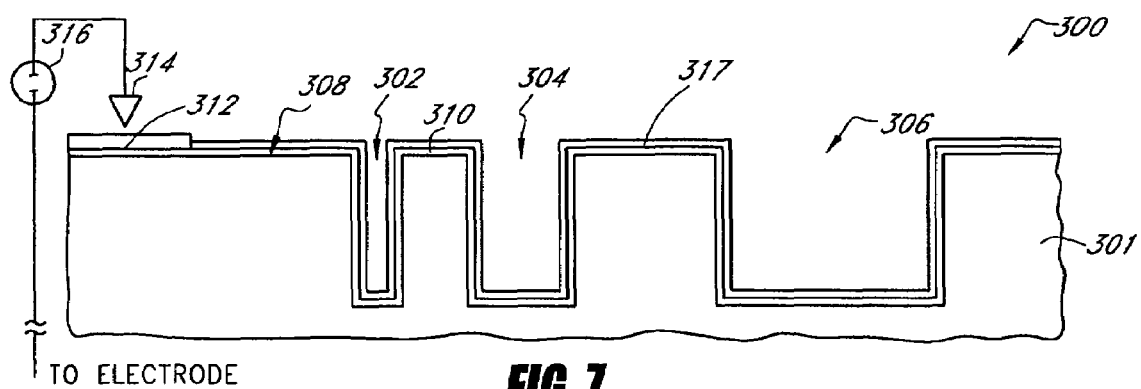
FIG. 7 is a schematic cross section of a conductive surface of a wafer comprising a barrier layer and a contact layer formed on the barrier layer, wherein a conductor layer is partially formed on the barrier layer, in accordance with a preferred embodiment of the invention.
Figure 8:
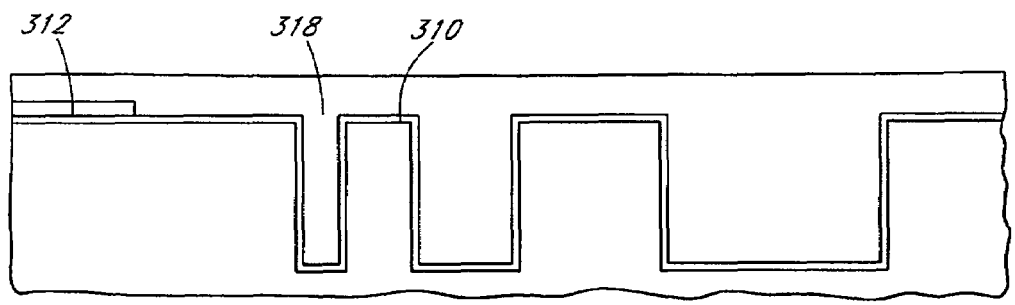
FIG. 8 is a schematic cross section of the conductive surface of FIG. 7, wherein plating has continued and been planarized, in accordance with a preferred embodiment of the invention.

FIGS. 7 and 8 illustrate an alternative embodiment for direct electrodeposition of a conductor such as copper on a barrier layer 310 and/or a nucleation layer by utilizing a contact layer 312 on the barrier layer and/or the nucleation layer. In this embodiment use of a contact layer, which is formed as described above, allows application of high voltages and current densities to the wafer for plating without causing damage to the barrier and/or the nucleation layer. This is due to the fact that the electrical contact is made to the contact layer, which is much more robust and lower resistance than the barrier and/or the nucleation layer. FIG. 7 illustrates the initial stage of an electrodeposition process on a substrate 300 comprising a dielectric layer 301. The dielectric layer 301 comprises a plurality of features, such as, e.g., a via 302, a mid-sized trench 304 and a large trench 306.

In this embodiment, the surface 308 of the dielectric layer 301 and the features 302, 304, 306 are coated with a barrier layer 310. In fact, the barrier layer 310 may be the nucleation layer itself or may have an additional thin nucleation layer (not shown) on its surface. The substrate 300 represents a surface area near an edge portion of a wafer, such as the one exemplified in FIG. 2. A contact layer 312 is initially formed on the barrier layer portion covering partially or fully the edge of the substrate 300. A contact member 314 connects the contact layer 312 to a power supply 316 which is also connected to an electrode (not shown). As an electrical potential difference is established between the contact layer 312 and the electrode, a first layer 317 of conductive material (e.g., Cu) is deposited on the barrier layer 310 coating it conformally. The first layer is a thin layer which conformally coats the features 302, 304 and 306 without filling them. This initial stage of the process may require a low current density, which may be about 0.01-10 milli amperes (ma)/cm$^2$.

Once this stage is completed, a gap fill electrodeposition process is applied to completely fill the features 302, 304 and 306. The gap fill electrodeposition process may be performed using either a planar electrodeposition as shown in FIG. 8 to form a planar conductive layer 318 or using an electrochemical deposition process to form the non-planar layer 320 shown in FIG. 9. At the gap fill stage, any remaining empty space within the features is filled by the application of a deposition current of about 5-60 ma/cm$^2$, which is applied to the thin copper layer already deposited on the barrier layer.

Although various preferred embodiments have been described in detail above, those skilled in the art will readily appreciate that many modifications of the exemplary embodiment are possible without materially departing from the novel teachings and advantages of the invention.

What is claimed is:

1. A method of manufacturing contact structures on a surface of a substrate to conduct electricity from a contact member to the surface when the surface is electroprocessed, comprising:

forming a conductive layer on the surface; and selectively coating a predetermined region of the conductive layer with a contact layer so that the contact member touches the contact layer as the electroprocessing is performed on the conductive layer, wherein selectively coating the predetermined region comprises selectively coating an edge region of the wafer.

2. A method of manufacturing contact structures on a surface of a substrate to conduct electricity from a contact member to the surface when the surface is electroprocessed, comprising:

forming a conductive layer on the surface; and selectively coating a predetermined region of the conductive layer with a contact layer so that the contact member touches the contact layer as the electroprocessing is performed on the conductive layer, wherein selectively coating the predetermined region comprises disposing a conductive paste onto the predetermined region.

3. A method of manufacturing contact structures on a surface of a substrate to conduct electricity from a contact member to the surface when the surface is electroprocessed, comprising:

forming a conductive layer on the surface; and selectively coating a predetermined region of the conductive layer with a contact layer so that the contact member touches the contact layer as the electroprocessing is performed on the conductive layer, wherein selectively coating the predetermined region comprises attaching a conductive tape onto the predetermined region.

4. A method of manufacturing contact structures on a surface of a substrate to conduct electricity from a contact member to the surface when the surface is electroprocessed, comprising:

forming a conductive layer on the surface; and selectively coating a predetermined region of the conductive layer with a contact layer so that the contact member touches the contact layer as the electroprocessing is performed on the conductive layer, wherein selectively coating the predetermined region forms a continuous contact layer.

5. A method of manufacturing contact structures on a surface of a substrate to conduct electricity from a contact member to the surface when the surface is electroprocessed, comprising:

forming a conductive layer on the surface; and selectively coating a predetermined region of the conductive layer with a contact layer so that the contact member touches the contact layer as the electroprocessing is performed on the conductive layer, wherein the contact layer has a width in the range of 0.5-5 mm.

6. A method of manufacturing contact structures on a surface of a substrate to conduct electricity from a contact member to the surface when the surface is electroprocessed, comprising:

forming a conductive layer on the surface; and selectively coating a predetermined region of the conductive layer with a contact layer so that the contact member touches the contact layer as the electroprocessing is performed on the conductive layer, wherein the contact layer has a thickness in the range of 0.1-100 micrometers.

7. A method of applying an electrochemical process to a surface of a wafer, comprising:

forming a conductive layer on the surface of the wafer;

selectively applying a contact layer to a portion of the conductive layer;

touching the contact layer with a contact member to connect the contact layer to a power supply; and applying an electrical potential to the contact member.

8. The method of claim 7, further comprising establishing a relative motion between the contact layer and the contact member.

9. The method of claim 7, wherein forming the conductive layer comprises forming a seed layer.

10. The method of claim 7, wherein selectively applying a contact layer to a portion of the conductive layer comprises depositing a conductor onto the portion of the conductive layer.

11. The method of claim 7, wherein selectively applying a contact layer to a portion of the conductive layer comprises disposing a conductive paste onto the portion of the conductive layer.

12. The method of claim 7, wherein selectively applying a contact layer to a portion of the conductive layer comprises attaching a conductive tape to the portion of the conductive layer.

13. The method of claim 7, wherein selectively applying a contact layer to a portion of the conductive layer comprises depositing conductive material on the portion of the conductive layer.

14. The method of claim 7, wherein the electrochemical process is electropolishing.

15. The method of claim 7, wherein the electrochemical process is electrodeposition.

16. The method of claim 7, further comprising removing the contact layer after applying the electrochemical process.

17. The method of claim 16, wherein removing the contact layer comprises etching off the contact layer by applying an etchant to the contact layer.

18. The method of claim 16, wherein removing the contact layer comprises physically removing the contact layer.

19. The method of claim 18, wherein physically removing the contact layer comprises peeling off the contact layer.

20. The method of claim 18, further comprising removing any material overlying the contact layer.

21. The method of claim 7, wherein forming the conductive layer comprises forming a barrier layer.

22. The method of claim 21, further comprising depositing a conductive material onto the barrier layer.

23. The method of claim 7, wherein selectively applying a contact layer to a portion of the conductive layer comprises selectively coating an edge region of the wafer.

24. The method of claim 23, wherein selectively coating an edge region of the wafer comprises forming a continuous contact layer along the edge region.

25. The method of claim 23, wherein selectively coating an edge region of the wafer comprises forming a discontinuous contact layer along the edge region.

26. A structure for electroprocessing a substrate, comprising:

a conductive layer formed on a surface of the substrate; and a removable contact layer formed on the conductive surface along an edge region of the substrate, wherein a contact member touches the removable contact layer and connects the removable contact layer to a power supply during electroprocessing of the substrate.

27. The structure of claim 26, wherein the conductive layer is a barrier layer.

28. The structure of claim 26, wherein the conductive layer is a seed layer.

29. The structure of claim 26, wherein the removable contact layer is an electroplated layer.

30. The structure of claim 26, wherein the removable contact layer is made of a conductive paste.

31. The structure of claim 26, wherein the removable contact layer is a conductive tape.

32. The structure of claim 26, wherein the removable contact layer has a width in the range of 0.5-5 mm.

33. The structure of claim 26, wherein the removable contact layer has a thickness in the range of 0.1-100 micrometers.

34. The structure of claim 26, wherein the substrate comprises vias and trenches.

35. The structure of claim 26, wherein the substrate comprises a silicon wafer.

36. The structure of claim 26, wherein the conductive material is a metal.

37. The structure of claim 36, wherein the metal is copper.

* * * * *